US008470625B2

(12) United States Patent
Zaima et al.

(10) Patent No.: US 8,470,625 B2
(45) Date of Patent: Jun. 25, 2013

(54) METHOD OF FABRICATING SEMICONDUCTOR LIGHT EMITTING DEVICE AND SEMICONDUCTOR LIGHT EMITTING DEVICE

(75) Inventors: Kotaro Zaima, Tokyo (JP); Toru Gotoda, Yokohama (JP); Toshiyuki Oka, Yokohama (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 108 days.

(21) Appl. No.: 13/037,687

(22) Filed: Mar. 1, 2011

(65) Prior Publication Data

US 2012/0056154 A1 Mar. 8, 2012

(30) Foreign Application Priority Data

Sep. 6, 2010 (JP) .................................. 2010-198699

(51) Int. Cl.
*H01L 33/18* (2010.01)
*H01L 33/06* (2010.01)
*H01L 21/268* (2006.01)
*H01L 21/428* (2006.01)

(52) U.S. Cl.
USPC ................................ 438/40; 438/39; 438/343

(58) Field of Classification Search
USPC ............................................ 438/39, 40, 343
See application file for complete search history.

(56) References Cited

U.S. PATENT DOCUMENTS

| 2009/0057695 A1* | 3/2009 | Nakahara ........................ 257/94 |
| 2009/0294784 A1* | 12/2009 | Nakahara et al. ............... 257/98 |
| 2011/0039356 A1 | 2/2011 | Ando et al. |

FOREIGN PATENT DOCUMENTS

| JP | 2006-352129 A | 12/2006 |
| JP | 2007-165858 | 6/2007 |
| JP | 2007-299935 A | 11/2007 |
| JP | 2010-40761 A | 2/2010 |
| JP | 2010-109015 | 5/2010 |
| JP | 2010-171371 A | 8/2010 |

OTHER PUBLICATIONS

U.S. Appl. No. 13/208,658, filed Aug. 12, 2011, Ono, et al.
U.S. Appl. No. 13/030,264, filed Feb. 18, 2011, Toshihide Ito, et al.

(Continued)

*Primary Examiner* — Zandra Smith
*Assistant Examiner* — Pamela E Perkins
(74) *Attorney, Agent, or Firm* — Oblon, Spivak, McClelland, Maier & Neustadt, L.L.P.

(57) ABSTRACT

A method of fabricating semiconductor light emitting device forms a laminated film by laminating an n-type nitride semiconductor layer, an active layer and a p-type nitride semiconductor layer in order on a uneven main surface of a first substrate, forms a plurality of first electrodes, on an upper surface of the p-type nitride semiconductor layer, forms a first metal layer to cover surfaces of the plurality of first electrodes and the p-type nitride semiconductor layer, forms a second metal layer on an upper surface of the second substrate, joins the first and second metal layers by facing the first and second substrates, cuts the first substrate or forming a groove on the first substrate along a border of the light emitting element from a surface side opposite to the first metal layer on the first substrate, and irradiates a laser toward areas of the light emitting devices from a surface side opposite to the first metal layer on the first substrate to peel off the first substrate.

13 Claims, 5 Drawing Sheets

OTHER PUBLICATIONS

U.S. Appl. No. 12/874,475, filed Sep. 2, 2010, Kotaro Zaima, et al.
U.S. Appl. No. 12,874,399, filed Sep. 2, 2010, Toru Gotoda, et al.
U.S. Appl. No. 12/874,625, filed Sep. 2, 2010, Toru Gotoda, et al.
U.S. Appl. No. 12/874,425, filed Sep. 2, 2010, Kotaro Zaima, et al.
Japanese Office Action Issued Aug. 3, 2012 in Patent Application No. 2010-198699 (with English translation).

* cited by examiner

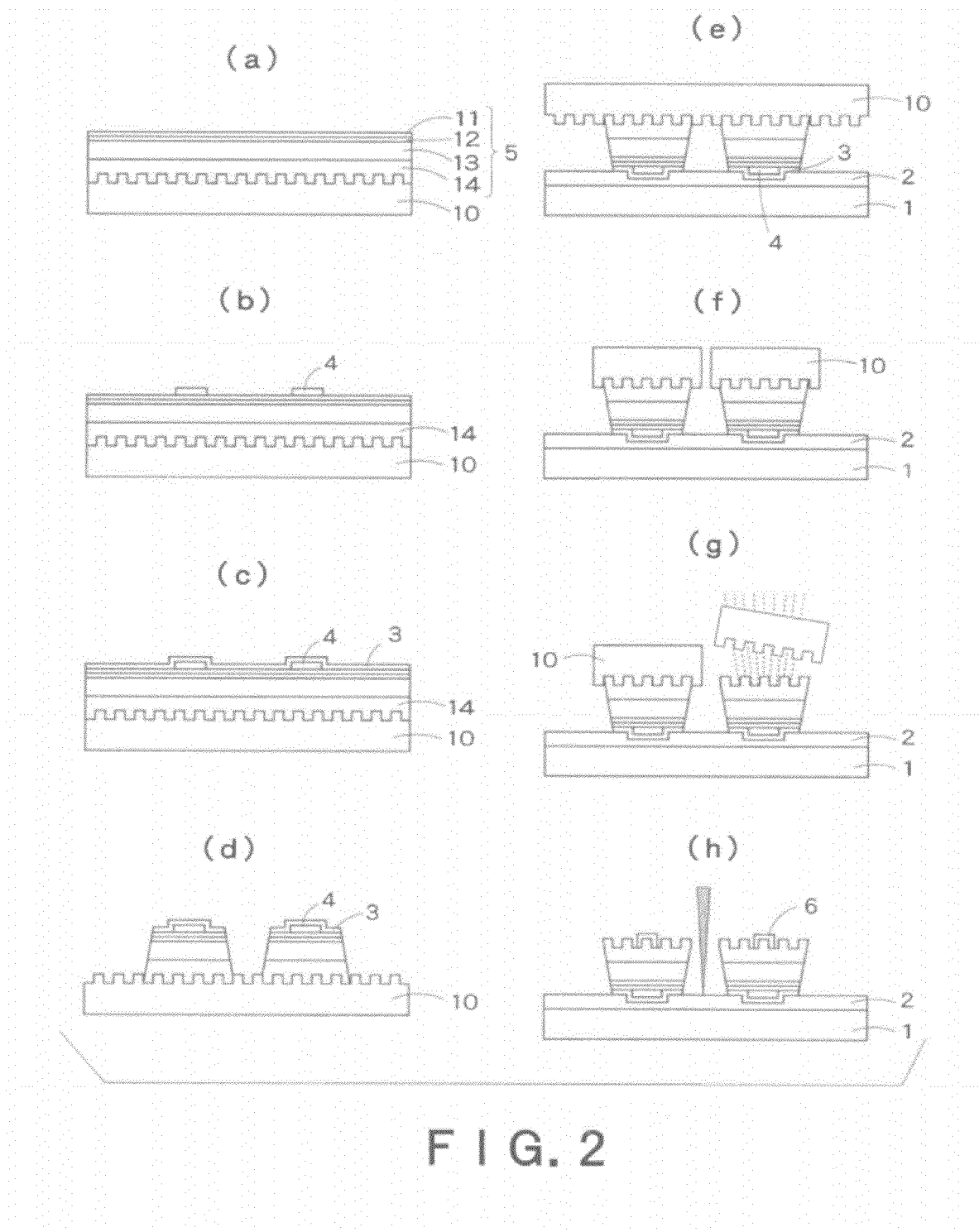
F I G. 2

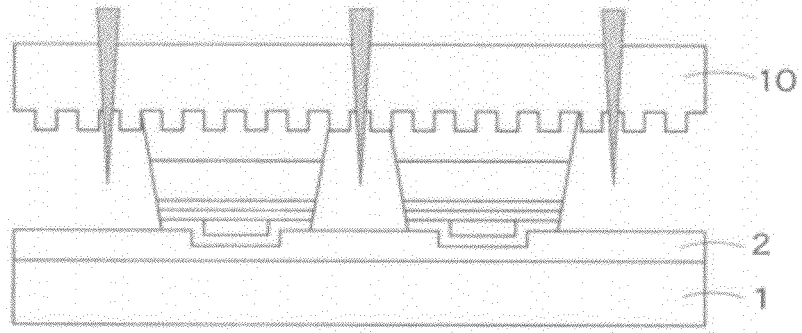
F I G. 3
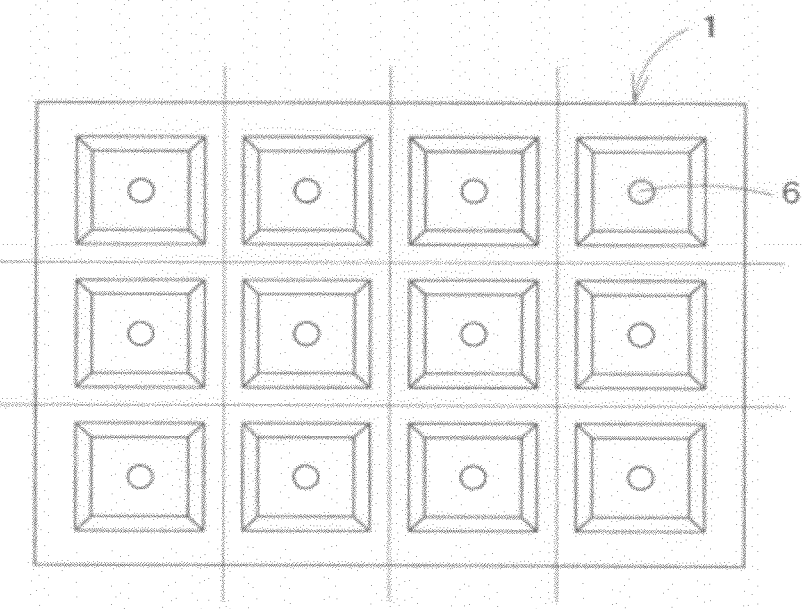
F I G. 4

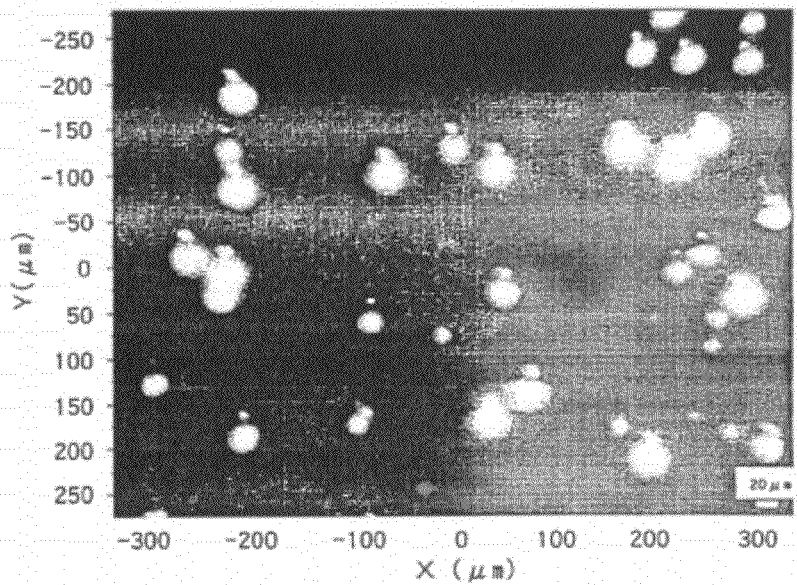
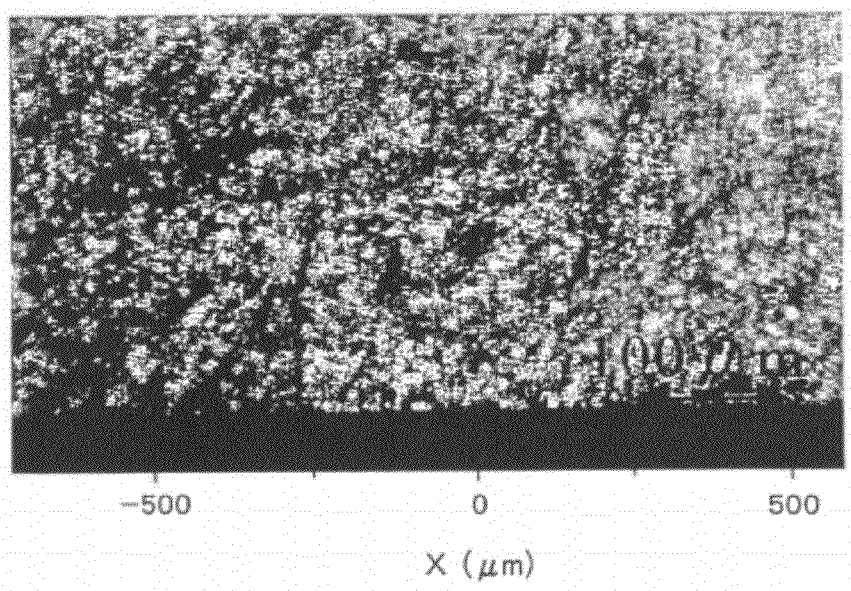
F I G. 5

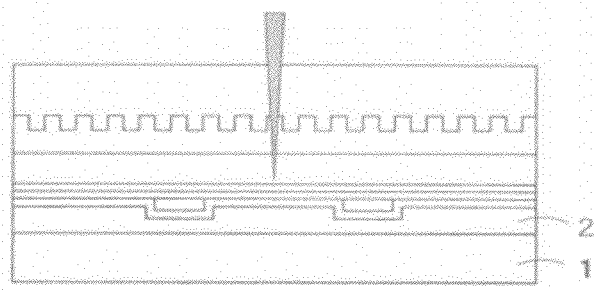
F I G. 6
(a)
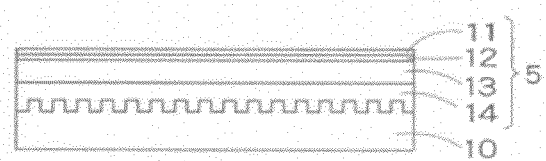
(b)
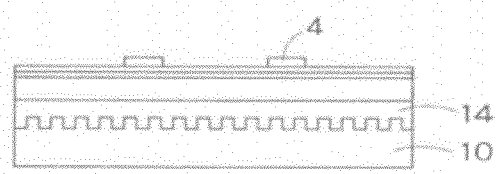
(c)
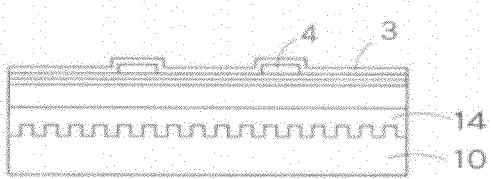
(d)
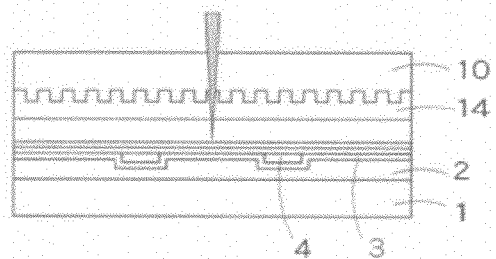
(e)
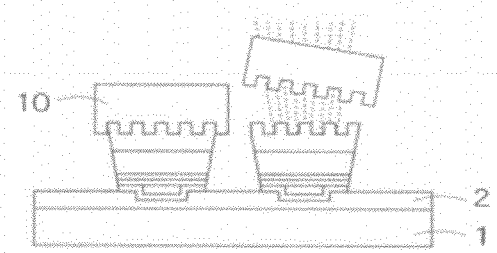
(f)
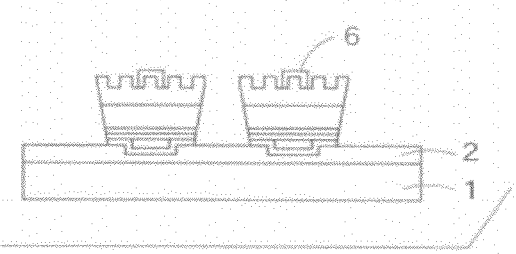
F I G. 7

METHOD OF FABRICATING SEMICONDUCTOR LIGHT EMITTING DEVICE AND SEMICONDUCTOR LIGHT EMITTING DEVICE

CROSS REFERENCE TO RELATED APPLICATIONS

This application is based upon and claims the benefit of priority from the prior Japanese Patent Application No. 2010-198699, filed on Sep. 6, 2010, the entire contents of which are incorporated herein by reference.

FIELD

The present invention relates to a semiconductor light emitting device fabrication method using a nitride semiconductor and a semiconductor light emitting device.

BACKGROUND

In order to apply nitride semiconductor light emitting devices (referred to as LED (Light Emitting Diode), hereinafter) to white light lighting apparatuses, it is inevitable to achieve higher optical efficiency and higher output performance. For this reason, improvements of internal quantum efficiency, light extraction efficiency, etc. have been advanced by research and development of crystal and device structures.

For the crystal growth of a nitride semiconductor, a sapphire substrate is often used, because it is cheap and stable at a high temperature, and it can grow with high crystalline quality by means of low-temperature buffer. The sapphire substrate is an insulator with no electrical conductivity and low thermal conductivity. For this reason, an electrode cannot be formed on the rear side of the sapphire substrate.

Accordingly, a light emitting device has been proposed in which an LED-structured crystal grown on a sapphire substrate is transferred onto another support substrate made of silicon, cupper, gold, etc. In the transfer process, laser lift-off is performed to peel off the sapphire substrate.

In the laser lift-off, a technique has been proposed in order to prevent micro cracks from being generated in a multi-layered nitride semiconductor layer. In the technique, a laser beam is radiated from above onto a transparent crystal wafer to be peeled off to form a groove at a depth of reaching the multi-layered nitride semiconductor layer. And then, a laser beam is radiated again from above onto the transparent crystal wafer to peel off the wafer.

The reason for forming the groove in the multi-layered nitride semiconductor layer before the peeling-off step is to release nitrogen gas through the groove. The nitrogen gas is generated when a part of the multi-layered nitride semiconductor layer is decomposed when irradiated with a laser beam in the peeling-off step.

Another technique has been proposed in which a groove is formed on a sapphire substrate at the location to be irradiated with a laser beam without completely peeling off a light emitting structure in a first separation step. The sapphire substrate is then irradiated with a laser beam to be peeled off in a second separation step.

The reason for providing the first separation step is to protect a conductive bonding layer or a permanent conductive substrate at the lower side of the light emitting structure from being damaged.

In the above two techniques, a laser beam is radiated several times in the laser lift-off step.

BRIEF DESCRIPTION OF THE DRAWINGS

FIG. 2 is a process view sequentially showing a fabrication process of the semiconductor light emitting device of FIG. 1;

FIG. 3 is a sectional view showing the irradiated positions of a laser beam;

FIG. 4 is a plan view showing the irradiated positions of a laser beam viewed from above;

FIG. 5($a$) is a view showing the light output characteristics of a comparative example and FIG. 5($b$) is a view showing the light output characteristics of the present embodiment;

FIG. 6 is a view explaining a separation step in a second embodiment; and

FIG. 7 is a process view sequentially showing a fabrication process of the semiconductor light emitting device according to the present embodiment.

DETAILED DESCRIPTION

Figure 1:
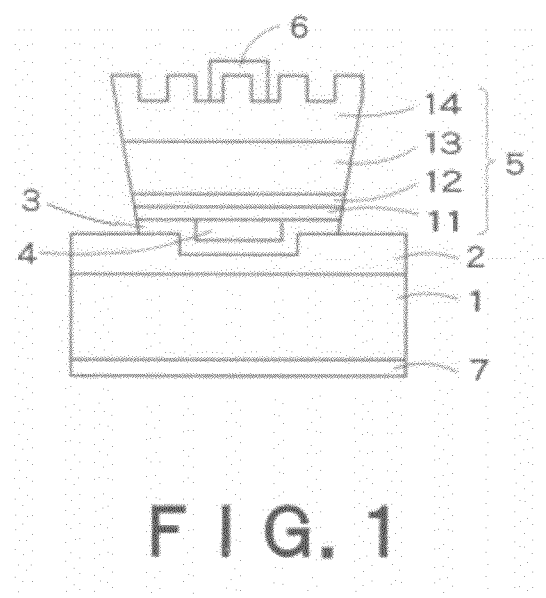
FIG. 1 is a sectional view of a semiconductor light emitting device according to an embodiment of the present invention.

Embodiments will now be explained with reference to the accompanying drawings.

A method of fabricating semiconductor light emitting device forms a laminated film by laminating an n-type nitride semiconductor layer, an active layer comprising a multiple quantum well structure of nitride semiconductors and a p-type nitride semiconductor layer in order on a uneven main surface of a first substrate. The method forms a plurality of first electrodes corresponding to a plurality of light emitting devices, respectively, on an upper surface of the p-type nitride semiconductor layer. The method forms a first metal layer to cover surfaces of the plurality of first electrodes and the p-type nitride semiconductor layer. The methods forms a second metal layer on an upper surface of a second substrate, the second metal layer being made of a material comprising a melting point lower than the melting point of the first metal layer. The method joins the first and second metal layers by facing the first and second substrates. The method cuts the first substrate or forming a groove on the first substrate along a border of the light emitting element from a surface side opposite to the first metal layer on the first substrate. The method irradiates a laser toward areas of the light emitting elements from a surface side opposite to the first metal layer on the first substrate to peel off the first substrate. The method forms a second electrode on at least a portion of a surface exposed by peeling off the laminated film.

FIG. 1 is a sectional view of a semiconductor light emitting device according to an embodiment. The semiconductor light emitting device of FIG. 1 has a first metal layer 2 provided on a support substrate 1, a second metal layer 3 provided on the first metal layer 2, a contact electrode 4 provided on a part of the second metal layer 3, a laminated film 5 made of a nitride semiconductor and provided on the second metal layer 3 and the contact electrode 4, an n-electrode 6 provided on the laminated film 5, and a p-electrode 7 provided at a surface side opposite to the first metal layer 2 on the support substrate 1.

The laminated film 5 is formed by laminating in order a p-type nitride semiconductor layer 11 (a p-type GaN layer, for example) provided on the second metal layer 3 and the contact electrode 4, an active layer 12 having a multiple quantum well structure of nitride semiconductors and provided on the p-type nitride semiconductor layer 11, an n-type nitride semiconductor layer 13 (an n-type GaN layer, for example) provided on the active layer 12, and a buffer layer 14 (a GaN layer, for example).

As understood from FIG. 1, the laminated film 5 has a reverse-tapered shape with a continuously-increased film-surface area from the p-type nitride semiconductor layer 11 toward the n-type nitride semiconductor layer 13. Although omitted in FIG. 1, a protective film may be formed on the side wall portion of the reverse-tapered shape.

The upper surface of the buffer layer 14 is roughened to be an uneven shape, and the n-electrode 6 is formed on a portion of this surface. This surface is a light extraction surface whereas the opposite contact electrode 4 has a light reflection surface.

The reason why the light extraction surface is uneven is that the uneven shape contributes to lower reflection on the border between the upper surface of the laminated film 5 and air, thus enhancing the light extraction efficiency.

The p-electrode 7 and the contact electrode 4 are electrically conductive each other through the support substrate 1. Therefore, the support substrate 1 requires electrical conductivity. The support substrate 1 is formed with, for example, a silicon substrate, a silicon carbide substrate, a substrate made by joining a silicon substrate and a germanium substrate, or a silicon substrate plated with metal such as copper.

A plane orientation of any one of (111), (110) and (100) is desired for the support substrate 1 when a silicon substrate is used. A silicon substrate having the plane orientation and an off angle can be used.

The material of the contact electrode 4 is silver, aluminum, etc. The material of the first metal layer 2 is a low melting point metal that is an eutectic metal, such as Au—Sn, Au—Si, Ag—Sn—Cu, and Sn—Bi or a non-solder material, such as Au, Sn, and Cu.

The area of the contact electrode 4 can be freely adjusted, in this embodiment. By enlarging the area of the contact electrode 4, the light emitted from the active layer 12 toward the p-electrode layer 7 can be efficiently reflected, thus enhancing the reflectivity. Moreover, an operation voltage can be lowered by enlarging the area of the contact electrode 4.

The material of the second metal layer 3 is preferably titanium (Ti), platinum (Pt), gold (Au) or tungsten (W).

FIG. 2 is a process view sequentially showing a fabrication process of the semiconductor light emitting device of FIG. 1. An example of the fabrication process of the semiconductor light emitting device of FIG. 1 will be explained based on FIG. 2. Firstly, a sapphire substrate 10 having the uneven surface is prepared. The uneven surface is formed, for example, by etching the substrate 10 with a patterned photoresist.

Next, as shown in FIG. 2(a), a plurality of nitride semiconductor layers are sequentially grown on the uneven surface of the sapphire substrate 10, for example, by metal organic chemical vapor deposition (MOCVD). In detail, the buffer layer 14, the n-type nitride semiconductor layer 13, the active layer 12 having a multiple quantum well structure of InGaN, and the p-type nitride semiconductor layer 11 are formed in this order on the uneven surface of the sapphire substrate 10.

Next, as shown in FIG. 2(b), the contact electrode 4 made of a laminated film of nickel (Ni) and silver (Ag) is formed on the p-type nitride semiconductor layer 11. The contact electrode 4 is formed for each semiconductor light emitting device. Next, as shown in FIG. 2(c), the second metal layer 3 is formed so as to cover the surfaces of the contact electrode 4 and the p-type nitride semiconductor layer 11. The second metal layer 3 is made of, for example, titan (Ti), platinum (Pt) and gold (Au) stacked in this order.

Through the step described above, the second metal layer 3 has convexities at the locations each corresponding to the area of the contact electrode 4.

Next, as shown in FIG. 2(d), the second metal layer 3 is patterned by a known lithographic technique to remove the second metal layer 3 from the area where no semiconductor light emitting device is formed. And, the laminated film 5 made of the buffer layer 14, the n-type nitride semiconductor layer 13, the active layer 12, and the p-type nitride semiconductor layer 11 is patterned so as to match the patterned second metal layer 3. With this patterning, the laminated film 5 is separated into structures corresponding to the respective semiconductor light emitting devices. Moreover, the laminated film 5 of each separated structure is formed into a reverse-tapered shape with a continuously-increased film-surface area from the p-type nitride semiconductor layer 11 toward the n-type nitride semiconductor layer 13.

The film surface is referred to as the upper surface of each layer. The laminated film 5 may be patterned with the patterned second metal layer 3 as a mask. Before the formation of the second metal layer 3, the laminated film 5 may be patterned and then the second metal layer 3 may be formed on the laminated film 5, as bonding metal.

Before or after the fabrication process of the sapphire substrate 10 described above, an Au—Su layer for the bonding metal is formed on a silicon substrate functioning as the support substrate 1. Then, as shown in FIG. 2(e), the second metal layer 3 on the sapphire substrate 10 and the bonding metal 2 on the silicon substrate 1 are disposed to face each other. Then, the second metal layer 3 on the sapphire substrate 10 and the bonding metal 2 on the silicon substrate 1 are pressed for a specific time at a high temperature of 250° C. or higher to be bonded to each other. The bonding is performed in such a manner that the contact electrode 4 cuts into the bonding metal 2 because the melting point of the contact electrode 4 is extremely higher than that of the bonding metal 2.

Next, as shown in FIG. 2(f), a separation step of the sapphire substrate 10 is performed. In the separation step, a pulsed beam of a UV (Ultra-Violet) laser, such as a KrF laser of 248 nm in wavelength, is radiated onto the sapphire substrate 10 from a surface side direction opposite to the second metal layer 3 on the sapphire substrate 10, to separate the substrate 10 in a grid form or form grooves thereon. In this case, the laser beam is radiated along the border between semiconductor light emitting devices.

As described above, in this embodiment, a laser beam is radiated to separate the sapphire substrate 10 into respective semiconductor light emitting devices, before the laser lift-off step.

FIG. 3 is a sectional view showing the irradiated positions of a laser beam. FIG. 4 is a plan view showing the irradiated positions of a laser beam viewed from above. As understood from these figures, a laser beam is radiated in a grid form along the border between semiconductor light emitting devices. The requirements of laser radiation may be the following requirement 1) or 2), but not necessarily limited thereto.

Requirement 1): A pulsed laser beam is radiated onto the sapphire substrate 10 to perform line scanning at a beam diameter of about 1 μm. A pulsed laser beam is radiated along each border between semiconductor light emitting devices at several times to reach a specific depth in the laminated film 15.

Requirement 2): A pulsed laser beam is radiated onto the sapphire substrate 10 to perform line scanning at a beam diameter of about 10 μm or smaller. Ablation of the sapphire substrate 10 is performed with the pulsed laser beam to form grooves thereon.

The sapphire substrate 10 is preferably about from 100 μm to 200 μm in thickness in either of the requirements 1) and 2).

The laser radiation does not aim for physical separation of the sapphire substrate 10, but for easy peeling-off of the substrate 10 in the laser lift-off step to be performed later. Therefore, the laser radiation in this step does not require such a laser intensity to penetrate through the sapphire substrate 10. With the laser radiation, the sapphire substrate 10 may be separated completely, as shown in FIG. 2(*f*). Or, the sapphire substrate 10 may have grooves formed thereon without being separated, as explained in the requirement 2).

Next, as shown in FIG. 2(*g*), the peeling-off step of the sapphire substrate 10 is performed. In the peeling-off step, a laser beam is radiated onto the sapphire substrate 10 from above to peel off the substrate 10 by the laser lift-off method. In this case, the laser beam is radiated onto the sapphire substrate 10 in an inside direction of the border of the semiconductor light emitting devices. In the former step, the sapphire substrate 10 has undergone the separation step so as to be physically separated or to have the grooves formed thereon. Therefore, the sapphire substrate 10 can be easily peeled off for each of the separated portions, even if laser intensity is not so much high.

According to the experiments by the inventor of the present embodiment, it was found that the sapphire substrate 10 can be peeled off with the radiation intensity (0.7 J/cm$^2$, for example) of about 10% to 20% smaller than the radiation intensity required for peeling off a sapphire substrate 10 with no concavities and convexities formed thereon. Therefore, according to this embodiment, when the sapphire substrate 10 is peeled off, the stress applied to the edges of the concavities and convexities can be weakened. Therefore, the risk of damage to the laminated film 5 at peeling-off can be reduced.

By peeling off the sapphire substrate 10, the GaN layer (the buffer layer 14) in the laminated film 5 is exposed. After the substrate surface with the laminated film 5 is covered with a protective film (not shown), the protective film is removed from the upper surface of the GaN layer and in the vicinity of the upper surface to form the n-electrode 6. As for the protective film, for example, an SiO$_2$ film is formed by a sputtering system.

The material of the protective film is preferably a material including at least one of silicon dioxide, silicon nitride, zirconium oxide, niobium oxide, and aluminum oxide. The material of the n-electrode 6 is preferably an alkali-resistant electrode material including at least one of metals: platinum (Pt), gold (Au), nickel (Ni), and titanium (Ti).

After that, dicing is performed at a broken-line section in FIG. 2(*h*) to obtain the semiconductor light emitting devices each shown in FIG. 1. The semiconductor light emitting devices thus obtained exhibited light output about three times higher than a comparative example in which the sapphire substrate 10 having the concavities and convexities formed thereon is peeled off without the separation step.

FIG. 5(*a*) is a view showing the light output characteristics of the comparative example discussed above. FIG. 5(*b*) is a view showing the light output characteristics of this embodiment. In this embodiment, the laminated film 5 is not damaged when the sapphire substrate 10 is peeled off. Therefore, as shown in FIG. 5(*b*), constant light emission is achieved over the entire area of the light extraction surface. On the contrary, in the comparative example, the laminated film 5 is damaged when the sapphire substrate 10 is peeled off, and hence light is not emitted from the damaged sections. Therefore, as shown in FIG. 5(*a*), light emission is irregular with lower light intensity.

Moreover, according to the experiments by the inventor of the present embodiment, it was found that the semiconductor light emitting device according to the present embodiment exhibited light output of about 10% to 20% higher than a semiconductor light emitting device fabricated with a sapphire substrate 10 having a flat surface.

As described above, in this embodiment, the sapphire substrate 10 is processed to have concavities and convexities formed thereon for the purpose of higher light extraction efficiency. And then, the sapphire substrate 10 undergoes the separation step with radiation of a laser beam along the border between semiconductor light emitting devices so that the laminated film 5 is not damaged. After the steps, the sapphire substrate 10 undergoes the peeling-off step with radiation of a laser beam for the purpose of peeling off the substrate 10.

Therefore, the sapphire substrate 10 can be relatively easily peeled off for each device, even if intensity of a laser beam to be radiated in the peeling-off step is not so much high, thereby preventing the laminated film 5 from being damaged in the peeling-off. Therefore, according to the present embodiment, the semiconductor light emitting device with higher light extraction efficiency and light emission efficiency is obtained.

Moreover, according to the present embodiment, the same laser source can be used for the separation and laser lift-off steps, thus reducing the fabrication cost.

(Second Embodiment)

The second embodiment has more simplified fabrication process than the first embodiment. In the second embodiment, the separation step is performed without patterning the laminated film 5.

In the first embodiment, the laminated film 5 is patterned before the separation step, to form an individual laminated film 5 for each semiconductor light emitting device. On the contrary, in this embodiment, the laminated film 5 is bonded to the support substrate 1 without being patterned and then the separation and peeling-off steps are performed sequentially, as shown in FIG. 6.

FIG. 7 is a process view sequentially showing a fabrication process of the semiconductor light emitting device according to the present embodiment. The steps in FIGS. 7(*a*) to 7(*c*) are the same as those in the first embodiment. Following to the steps, the first metal layer 2 on the support substrate 1 and the second metal layer 3 on the sapphire substrate 10 are bonded to each other.

Next, the separation step is performed to radiate a laser beam onto the surface of the sapphire substrate 10, the opposite of the second metal layer 3. The laser beam is radiated along the border between semiconductor light emitting devices. In this embodiment, the laser radiation intensity is adjusted higher than the first embodiment so that both of the sapphire substrate 10 and the laminated film 5 are separated. As described in the first embodiment, however, it is unnecessary to physically separate the sapphire substrate 10. Only the grooves may be formed on the substrate 10.

Next, as shown in FIG. 7(*e*), the peeling-off step is performed to radiate a laser beam onto the surface of the sapphire substrate 10, the opposite of the second metal layer 3. The laser beam is radiated onto the sapphire substrate 10 from the border between semiconductor light emitting devices to the inside of the border. Through this step, the sapphire substrate 10 is peeled off, and since the laminated film 5 is cut by the separation step, the laminated film 5 is separated for each semiconductor light emitting device.

After that, in the same way as the first embodiment, the protective film, the n-electrode 6, etc. are formed, followed by dicing, thus finishing the semiconductor light emitting device.

As described above, in the second embodiment, the separation step is performed without patterning the laminated film 5, with a laser beam, through the sapphire substrate 10, of radiation intensity enough for the separation step for the laminated film 5. Therefore, in the later-stage peeing-off step, the sapphire substrate 10 can be easily peeled off and so is the laminated film 5. Accordingly, this embodiment provides a more simplified fabrication process than the first embodiment, because of no requirement of patterning step for the laminated film 5.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method of fabricating a semiconductor light emitting device, comprising:
   forming a laminated film by laminating an n-type nitride semiconductor layer, an active layer comprising a multiple quantum well structure of nitride semiconductors and a p-type nitride semiconductor layer in order on a uneven main surface of a first substrate;
   forming a plurality of first electrodes corresponding to a plurality of light emitting devices, respectively, on an upper surface of the p-type nitride semiconductor layer;
   forming a first metal layer to cover surfaces of the plurality of first electrodes and the p-type nitride semiconductor layer;
   forming a second metal layer on an upper surface of a second substrate, the second metal layer being made of a material comprising a melting point lower than the melting point of the first metal layer;
   joining the first and second metal layers by facing the first and second substrates;
   cutting the first substrate or forming a groove on the first substrate along a border of the light emitting element from a surface side opposite to the first metal layer on the first substrate;
   irradiating a laser toward areas of the light emitting elements from a surface side opposite to the first metal layer on the first substrate to peel off the first substrate;
   forming a second electrode on at least a portion of a surface exposed by peeling off the laminated film;
   wherein when the first substrate is cut or the groove is formed on the first substrate, the laser is irradiated by a first irradiation condition along the border of the light emitting elements from a surface side opposite to the first metal layer on the first substrate, and
   when the first substrate is peeled off, the laser is irradiated by a second irradiation condition different from the first irradiation condition toward areas of the light emitting elements from a surface side opposite to the first metal layer on the first substrate.

2. The method of claim 1, wherein the second irradiation condition is set to prevent the laminated film from being damaged by the laser.

3. The method of claim 1, wherein before the first metal layer and the second metal layer are joined to each other, the first metal layer and the laminated film on the first substrate are patterned corresponding to the plurality of light emitting elements.

4. The method of claim 1, wherein the first and second metal layers are joined, and the first substrate is cut or the groove is formed on the first substrate without patterning the first metal layer and the laminated film on the first substrate; and
   when the first substrate is cut or the groove is formed on the first substrate, the laser is irradiated by a irradiation condition that a light of the laser reaches the laminated film.

5. The method of claim 1, wherein the plurality of light emitting elements are formed in a grid form on the first substrate; and
   when the first substrate is cut or the groove is formed on the first substrate, the laser is irradiated by the first irradiation condition in a grid form along a border of the plurality of light emitting elements.

6. The method of claim 1, wherein when the first substrate is cut or the groove is formed on the first substrate, the laser is scanned line by line on the first substrate while a beam size of the laser is set to a predetermined size so that the first substrate is cut.

7. The method of claim 1, wherein when the first substrate is cut or the groove is formed on the first substrate, the laser is scanned line by line on the first substrate while a beam size of the laser is set to a predetermined size so that the groove is formed on the first substrate without cutting the first substrate.

8. The method of claim 1, wherein the main surface of the first substrate is etched so that the main surface becomes uneven.

9. The method of claim 1, further comprising,
   forming a protective film on the laminated film exposed by peeling off the first substrate, wherein the second electrode is formed by removing a portion of the protective film.

10. The method of claim 9, wherein the protective film comprises at least one of silicon dioxide, silicon nitride, zirconium oxide, niobium oxide, and aluminum oxide.

11. The method of claim 1, wherein the second electrode comprises at least one of platinum (Pt), gold (Au), nickel (Ni), and titanium (Ti).

12. The method of claim 1, wherein the first substrate is a sapphire substrate.

13. The method of claim 1, wherein the laser used when the first substrate is cut or the groove is formed on the first substrate is UV (Ultra-Violet) laser or KrF laser.

* * * * *